United States Patent [19]
Kobayashi et al.

[11] Patent Number: 5,166,724
[45] Date of Patent: Nov. 24, 1992

[54] IMAGE PRINTER/COPIER WITH A COMMON HEATER FOR DEVELOPMENT AND TRANSFER PRESSURE OF LATENT IMAGES ON MICROCAPSULE MEDIUMS

[75] Inventors: Atushi Kobayashi; Hiroshi Asawa; Yujiro Nomura, all of Suwa, Japan

[73] Assignees: Seiko Epson Corporation; Seiko Instruments, Inc., both of Tokyo, Japan

[21] Appl. No.: 784,495

[22] Filed: Oct. 29, 1991

[30] Foreign Application Priority Data

| Nov. 1, 1990 | [JP] | Japan | 2-296011 |
| Mar. 18, 1991 | [JP] | Japan | 3-052088 |
| Aug. 2, 1991 | [JP] | Japan | 3-194280 |

[51] Int. Cl.[5] .................... G03B 27/32; G03B 27/52
[52] U.S. Cl. ............................................ 355/27; 355/30
[58] Field of Search ............... 355/27, 30; 430/138; 354/301

[56] References Cited

U.S. PATENT DOCUMENTS

| 4,799,085 | 1/1989 | Nagumo et al. | 355/27 |
| 4,841,339 | 6/1989 | Taniguchi | 355/27 |
| 4,864,356 | 9/1989 | Asano et al. | 355/30 |
| 4,910,550 | 3/1990 | Ohashi et al. | 355/27 |
| 4,942,420 | 7/1990 | Tomizawa et al. | 355/27 |
| 4,992,816 | 2/1991 | Nakamura et al. | 354/301 |
| 5,028,954 | 7/1991 | Yamamoto et al. | 355/30 |
| 5,041,865 | 8/1991 | Asano et al. | 355/30 |
| 5,068,684 | 11/1991 | Abe et al. | 355/27 |

Primary Examiner—Richard A. Wintercorn
Attorney, Agent, or Firm—W. Douglas Carothers, Jr.; Gregory D. Ogrod

[57] ABSTRACT

An embodiment of the present invention is a microcapsule image printer/copier system, having a mechanism for transporting microcapsule film medium, a heater for raising the temperature of the film medium to an image developing temperature, and a pair of transfer rollers for simultaneously applying both heat and pressure sufficient to transfer a developed image from the film medium to a transfer medium. First and second rollers deliver pressure and heat in a pinching contact with both film and transfer mediums. The heater is within a tube section of the first roller and is operated such that developing temperature and transfer pressure heat are substantially the same, thus eliminating wrinkles.

20 Claims, 4 Drawing Sheets

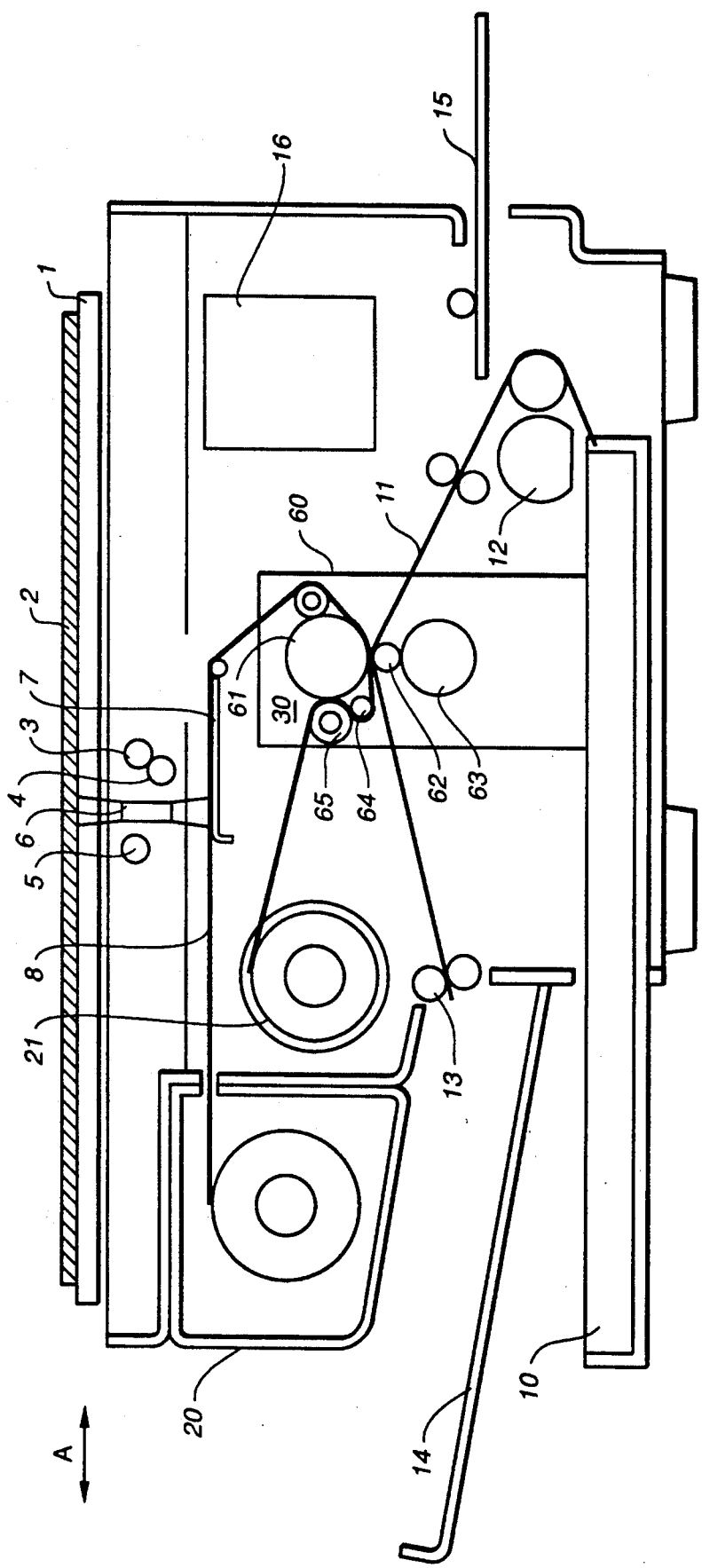
FIG._1

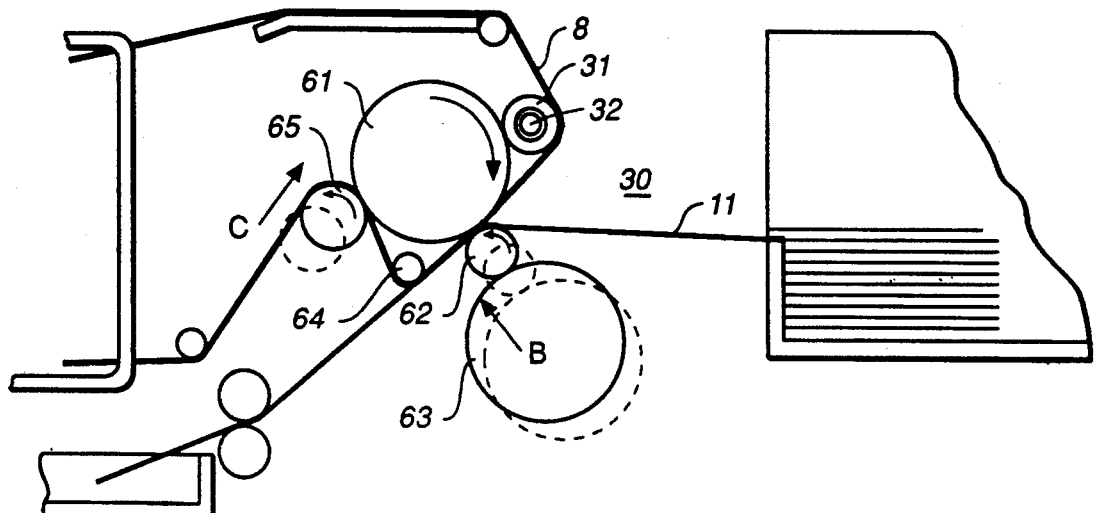
FIG._2
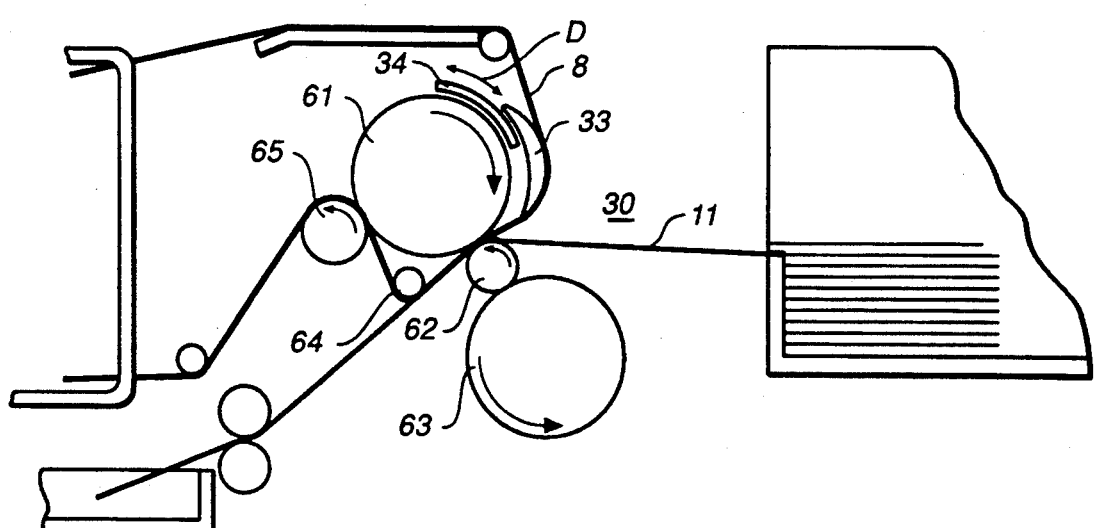
FIG._3

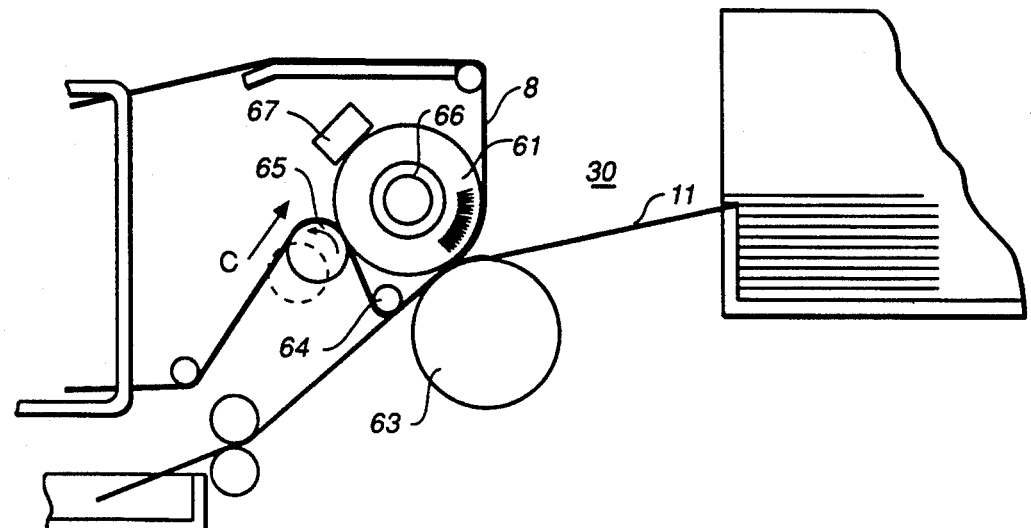
FIG._4
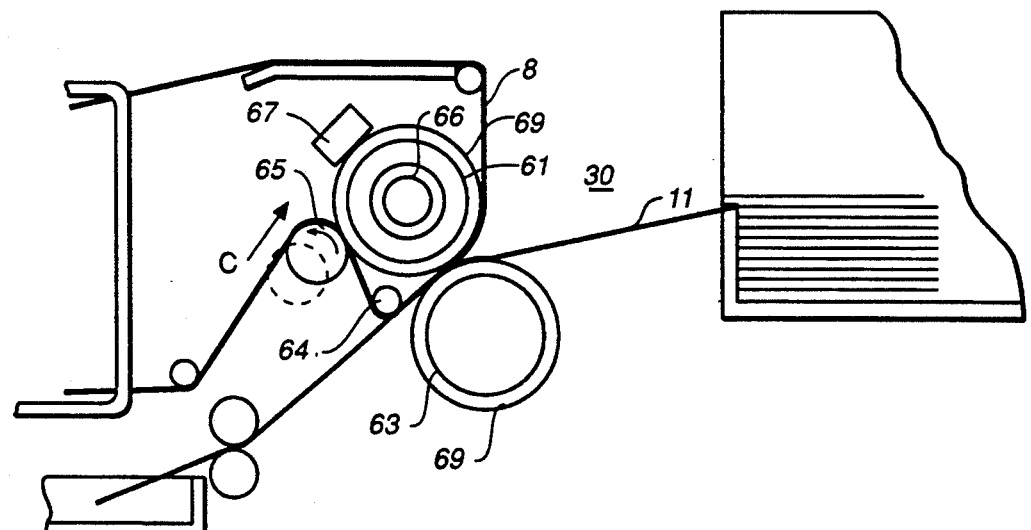
FIG._7

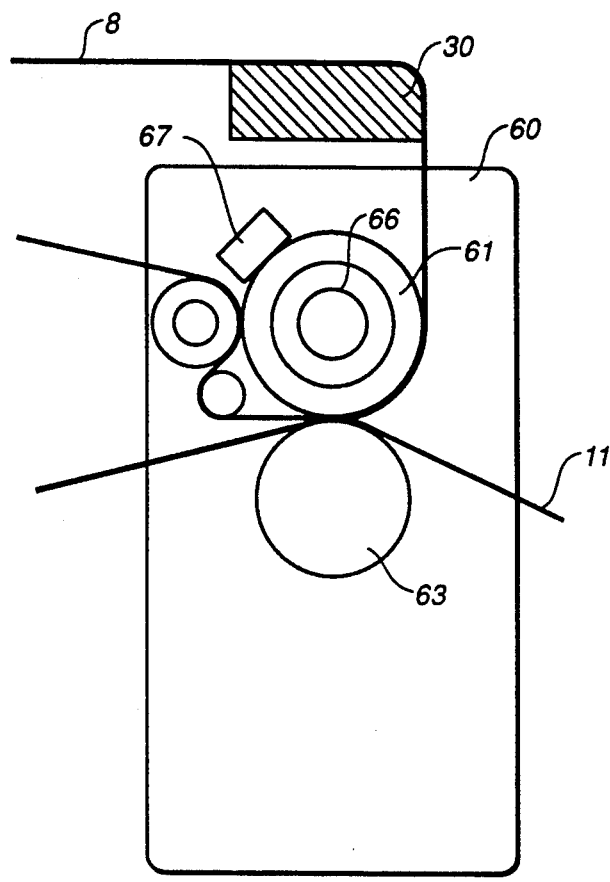
FIG._5
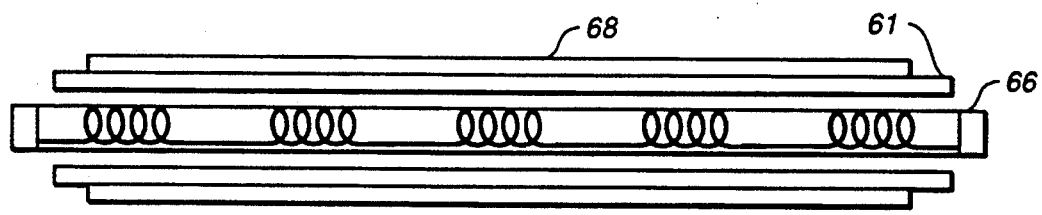
FIG._6

IMAGE PRINTER/COPIER WITH A COMMON HEATER FOR DEVELOPMENT AND TRANSFER PRESSURE OF LATENT IMAGES ON MICROCAPSULE MEDIUMS

BACKGROUND OF THE INVENTION

1. Field of the Invention

The present invention relates generally to copiers, printers and other image printers that produce images by using a photosensitive transfer type development heat material, and more particularly it relates to development heat and transfer pressure devices that develop exposed images by heat and transfer the developed images to paper using pressure.

2. Description of the Prior Art

There are many methods and devices in use for printing images on paper, the ubiquitous xerographic-based office copier and laserprinter being prime examples in the United States. A prior art example of an image printer that uses a photosensitive transfer type development heat material is disclosed in Japanese Laid-Open Patent Publication 62-147461. These types use an intermediate medium that is photosensitive and can print a copy of the image that was focused on it by transferring the image to paper under both heat and pressure. Inks exist in microcapsules held on with a binder to the medium. See, U.S. Pat. No. 4,399,209. A plain pressure roller is used in some that have separate transfer pressure and heating. A uniform and sufficient pressure over an entire image area usually requires sandwiching the image mediums between rigid rollers. Metal pressure rollers are therefore usually used. Japanese Laid-Open Patent Publication 62-232653 discloses that a compact device can be made by adding a heating device to a transfer pressure device which also allows a reduction in the necessary pressure.

The prior art has some significant problems. First, since development heat and transfer pressure mechanisms are separate, and maintained at independent temperatures. This adds cost and complexity. In the cases where the two mechanisms are adjacent to one another, each is affected by the temperature of the other. Time is needed to stabilize the two, and this introduces delays. Outside environment changes can also upset the temperature control, and image quality will suffer as a result. Second, since there are two heating mechanisms, so a large number of parts is needed to independently and accurately control the temperatures of both, thus making the printer surprisingly large and the control circuits complicated.

In the prior art, there is often no heater for transfer pressure or heaters for developing and transfer pressure were independent of each other. High transfer pressure temperatures were not tried, since that would make the device more complicated and would increase costs.

A low cost image printer that is compact, light-weight, and can simply and consistently produce high quality images is needed.

SUMMARY OF THE INVENTION

According to the present invention, an image printer comprises a photosensitive medium covered by microcapsules, means for development heat an image exposed on the surface of the medium, and means to transfer the image to paper by pressing the photosensitive medium and paper together. Heat for image development and transfer pressure comes from a single source. The photosensitive medium has numerous microcapsules on its surface. A suitable temperature difference is maintained between development heat and transfer pressure. Alternatively, a good image can be obtained by raising the transfer pressure temperature so that it approximates the development temperature.

An advantage of the present invention is that the higher the transfer pressure temperature, the more the pressure can reduced, without sacrificing image quality. The coloring materials contained in the microcapsules and the binder holding the microcapsules to the support medium soften more readily.

Another advantage of the present invention is that by using a configuration that uses the same heater for heating in development heat and heating in transfer pressure, a low cost, simple image printer can be offered that is lighter and more compact.

Another advantage of the present invention is that since development heat and transfer pressure are performed at nearly the same temperature, the configuration is not only further simplified, a low cost image printer can be offered that produces consistently high quality images.

Another advantage of the present invention is that a more simplified configuration, improved image quality, higher reliability and lower cost can be achieved by using part of the roller of the transfer pressure device to do development heat.

Another advantage of the present invention is that by forming the surface of one or both of the rollers of the transfer pressure device with silicon rubber, plastic or other plastic material, unevenness in both the temperature and pressure can be reduced, thus reducing uneven density appearing in the image and greatly improving image quality.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a front cross section of a copier showing an embodiment of the invention;

FIG. 2 is a front cross section showing an embodiment of a development heat and transfer pressure device employing the same heater;

FIG. 3 is a front cross section showing another embodiment of a development heat and transfer pressure device employing the same heater;

FIG. 4 is a front cross section showing an embodiment of a development heat and transfer pressure device operated at the same temperature;

FIG. 5 is a front cross section showing another embodiment of a development heat and transfer pressure device operated at the same temperature;

FIG. 6 is a cross section of a pressure roller with a rubber covered surface; and FIG. 7 is a front cross section showing an embodiment in which the surface of both rollers of the transfer pressure device is covered with rubber.

DETAILED DESCRIPTION OF EMBODIMENTS OF THE PRESENT INVENTION

FIG. 1 is a photocopier, according to an embodiment of the present invention of the invention, where a common heater is used for development heat and transfer pressure. A document-to-be-copied 2 is set on a document table 1 which moves in a direction "A." A light source comprised of a red lamp 3, a green lamp 4 and a blue lamp 5, illuminates document-to-be-copied 2. Reflected light passes through a lens 6 and focuses an image on a photosensitive medium 8, which slides over an exposure platform 7. The above elements 1 and 3-8 constitute a so-called "scan exposure system." Photosensitive medium 8 feeds in a continuous sheet from a cartridge 20, and is exposed over exposure platform 7. A latent image on medium 8 is then heat developed by a developer 30. Cut sheets of a transfer medium 11 are stored in a paper supply tray 10. The cut sheets are picked up by paper supply mechanism 12, and are aligned with the photosensitive medium 8 and in sync with an image area. The two mediums 8 and 11 are pressed together and an image is transferred to medium 11 under roller pressure in transfer sub-system 60. Transfer sub-system 60 has an upper roller 61, a middle roller 62, and a lower roller 63. Upper roller 61 and middle roller 62 have a line of high pressure contact between them. The travel distance for medium 8 from lens 6 to roller 61 is relatively short, compared to prior art systems. This helps conserve medium 8 by wasting less of it in the leaders and trailers that are necessary between image exposures.

Medium 8 is preferably a photosensitive heat-developing pressure transferring type of material having microcapsules on its surface that contain photosensitive silver halide, reducing agents, polymer compounds, and coloring materials, such as described in Japanese Laid-Open Patent Publication 61-275742. In the United States, such material is often referred to as Mead paper. In Japan, one example is sold under the trademark, CYCOLOR, by Seiko Mead Corporation (Tokyo). This type of photosensitive medium should be used at a development temperature of 120°-180° C. For transfer pressure, acceptable image quality can be realized at room temperatures. But heating to 50°-100° C. allows the pressure to be reduced to one-half to one-third of that needed at normal temperature. Generally speaking, the higher the transfer roller temperature is raised, the more the necessary pressures can reduced without sacrificing image quality. The coloring materials contained in the microcapsules and the binder holding the microcapsules to the support medium soften more readily at the higher temperatures. However, when the temperature is raised too high, uneven density, image shift, and other problems appear in the output image, probably due to the heat resistance of the support medium, etc. The temperature that can be used therefore has limits.

Transfer medium 11 (the paper) is separated from photosensitive medium 8 by a separation roller 64 and passes between transport rollers 13 to be ejected into a copy output bin 14. Photosensitive medium 8 travels around a pinch roller 65, and is wound onto a take-up drum 21. Pinch roller 65 is moved in a direction "C" (FIG. 2) to press against the upper roller 61 to ensure that medium 8 does not slip. A manual paper feed entrance 15 and a air filter 16 help circulate air into and out of the machine.

In FIG. 2, a latent image on medium 8 is developed by a heated roller 31 in developer 30. Roller 31 can be made of a hollow aluminum tube having a 20-mm outside diameter (OD). A 300W halogen lamp 32 (with a stick-like shape) is positioned inside the pipe to heat the inside of the tube. Heat from the lamp eventually reaches the photosensitive medium 8 from the backside of the medium, which is opposite to the side with the latent image. Cut sheets of transfer medium 11 are gathered and aligned to the image on medium 8. Middle and lower rollers 62 and 63 are moved together in a direction "B" to press mediums 8 and 11 between upper and middle rollers 61 and 62. Upper roller 61 can be a 60 mm OD steel tube. As such, it stores heat well and can deliver heat to both mediums 8 and 11 across the line of their contact between rollers 61 and 62. By adjusting the diameters an/or the materials of upper roller 61 and heat developer roller 31, the temperature of the upper roller 61 can be manipulated without affecting the developing temperature. Thus transfer pressure temperature can be independently tailored to the photosensitive medium 8 being used.

The developing temperature can be controlled by managing the power to heater 32. Experiments were run in which a number of temperatures were tried, a difference between the developing temperature and the transfer pressure temperature that gave good results was generally 20° C. to 30° C.

FIG. 3 is another embodiment of the present invention in which transfer pressure and development heat use the same heater. Medium 8 receives development heat as it passes by a crescent moon shaped heater 33 before being pinched under pressure between upper and middle rollers 61 and 62. Roller 61 receives radiant heat from heater 33 (as opposed to conducted heat). A heat shield 34 can be moved back and forth in a direction D to vary the radiant heat coupling. Thus, the temperature of upper pressure roller 61 can be manipulated in real-time so precise transfer pressure temperatures can be obtained easily, even by user adjustment.

FIG. 4 shows another embodiment of the present invention comprising a dual-purpose transfer pressure and development heat device. A halogen lamp heater 66 is positioned inside upper roller 61, which in this case is hollow. A temperature sensor 67 is stationed on upper roller 61 to help control the temperature of roller 61. Heat for developing comes from running photosensitive medium 8 in contact with upper roller 61. The heat development area is shown hatched in FIG. 4. Development and transfer pressure heat are about the same. This heater configuration is extremely simple, and the paper and medium paths are simplified (and more likely to give consistently good results and less likely to jam).

Experiments indicate temperatures of 80° to 160° C. at roller 61 give good results. The best results are seen when the temperature is 100° to 140° C. The transfer pressure can be reduced at even lower temperatures, but this will greatly increase the developing time, because the reaction accelerator in photosensitive medium 8 is impeded. Reaction accelerators having small activation energies can be used, but the shelf-life would then be compromised.

In the high temperature ranges, even though the transfer pressure can be lowered as the temperature is raised and the heating time for development heat is shortened, the heat resistance of medium 8 begins to interfere. A thin polyethylene terephthalate (PET) film is generally used as a support. It has a low cost, wide areas of applicability, good heat conduction, and other advantages. However, it does not tolerate heat well and is hard to handle. When high temperatures are used, the materials, control, cost, and other factors related to the heater, all add individual constraints, so maximum practical temperatures are limited.

Where development and transfer pressure temperatures are nearly the same and cannot be changed, the speed photosensitive medium 8 is moved can be changed, if the characteristics of photosensitive medium 8 require it. The angle at which photosensitive medium 8 winds around upper roller 61 and the diameter of upper roller 61 can be modified without affecting the temperature. This helps to get the necessary development heat conditions.

FIG. 5 is another embodiment of the present invention, involving developer 30 and transfer sub-system 60. Heaters for the development heat and transfer pressure are independent. Roller 61 has a halogen lamp heater 66 inside its hollow. Developer 30 has a second heater, not shown, that keeps the temperature of developer 30 about the same as that of transfer sub-system 60. Since both are nearly the same temperture, they interact very little, even when adjacent to each other. Thus it is possible to maintain a stable temperature over very long periods. Since photosensitive medium 8 will arrive at transfer sub-system 60 immediately after developing at nearly the same temperature, almost no thermal expansion or contraction occurs. Thus reducing the likelihood of wrinkles (which can spoil the image quality).

Various types of heat sources can be used, such as ceramic heater nichrome, and other heating resistor elements, instead of halogen lamp heaters described above.

FIG. 6 shows upper roller 61 with a rubber covered surface 68 comprising a plastic material. With hollow rollers, it is hard to get a good cylindrical shape, but covering the surface of the roller with a soft material, such as plastic, helps absorb out-of-round defects. The transfer pressure can be made more uniform and density variations and wrinkles are less of a problem. Sharp image output has been obtained when surface 68 comprised a coat of silicon rubber 0.1 mm thick.

FIG. 7 shows an embodiment of the present invention in which the surfaces of both upper and lower rollers 61 and 63 were coated with a urethane rubber 69. When the surface of only one of the rollers is coated with a rubber or plastic, too much slippage can occur between transfer medium 11 and photosensitive medium 8, resulting in poor image reproduction. When surfaces 69 were made of a 2-mm-thick urethane rubber, and upper roller 61 was 80° C., with a pressure of 300 kgf (for A4 size paper width), good results were observed. Since lower roller 63 does not have a heater, it could be a concern as to whether or not the transfer pressure temperature would ever stabilize. But the urethane rubber 69 covering the surface of the lower roller 63 functions as an insulator, and consistent image quality can be obtained by controlling only the temperature of upper roller 61.

Silicon rubber and urethane rubber have been described, but the present invention is not limited to these. Other kinds of silicon rubber or plastic materials can be used, just so long as they have a certain amount of heat resistance and easily undergo plastic deformation. Since the pressures used are relatively high in the lower temperature ranges, the rollers must be sufficiently rigid. With higher temperatures, the pressures can be lowered, thus enabling the whole roller to be made of silicon rubber, plastic or other plastic materials.

Above, conduction heating is used for both development and transfer pressure heat. The invention is not so limited. Radiant heating, hot air heating, induction heating, resistance heating, or any combination of these can be used with good results.

Instead of the fixed roller system described in this embodiment, pressure can be applied in the transfer pressure system by the reciprocating or circular action of a small roller, and instead of a roller pressure system, impact or ultrasound vibration can be used.

A copier has been used here to explain the present invention, but the invention is not limited to this, and it can be applied to printers, facsimile machines, electronic cameras, and photocopiers, in general.

While the invention has been described in conjunction with several specific embodiments, it is evident to those skilled in the art that many further alternatives, modifications and variations will be apparent in light of the forgoing description. Thus, the invention described herein is intended to embrace all such alternatives, modifications, applications and variations as may fall within the spirit and scope of the appended claims.

What is claimed is:

1. A microcapsule image printer/copier system, comprising:
   means for transporting a microcapsule film medium having a latent image on a first surface opposite to a second surface;
   a heated roller for rolling contact with said second surface and for raising the temperature of said film medium to a developing temperature of said latent image; and
   transfer roller means in rolling contact with the heated roller and for simultaneously communicating both heat and a pressure sufficient to transfer a developed image from said film medium to a transfer medium, said pressure being substantially less than that required when the transfer roller means is not heated.

2. The system of claim 1, wherein:
   the heated roller is capable of maintaining said development temperature between 80° C. and 160° C.

3. The system of claim 1, wherein:
   the heated roller is capable of maintaining said development temperature between 100° C. and 140° C.

4. The system of claim 1, wherein:
   said heat applied by the transfer roller means is 20° C. to 30° C. less than that of said developing temperature.

5. The system of claim 1, wherein:
   said heat applied by the transfer roller means is in the range of 50° to 100° C., and as such, the pressure is one-half to one-third of that needed at normal unheated temperatures.

6. A microcapsule image printer/copier system, comprising:
   means for transporting a microcapsule film medium having a latent image on a first surface;
   a heater for sliding contact with said second surface and for raising the temperature of said film medium to a developing temperature of said latent image;
   transfer roller means in radiant heat communication with the heater and for simultaneously applying both heat and a pressure sufficient to transfer a developed image from said film medium to a transfer medium, said pressure being substantially less than that required when the transfer roller means is not heated; and
   heat shield means for modulating the degree of radiant heat communication between the heater and transfer roller means.

7. The system of claim 6, wherein:
the heat shield means comprises means to adjust the heat and pressure combination in the transfer roller means for optimum transferred image quality.

8. The system of claim 6, wherein:
the heater is capable of maintaining said development temperature between 80° C. and 160° C.

9. The system of claim 6, wherein:
the heater is capable of maintaining said development temperature between 100° C. and 140° C.

10. The system of claim 6, wherein:
said heat applied by the transfer roller means is 20° C. to 30° C. less than that of said developing temperature.

11. The system of claim 6, wherein:
said heat applied by the transfer roller means is in the range of 50° to 100° C., and as such the pressure is one-half to one-third of that needed at normal unheated temperatures.

12. A microcapsule image printer/copier system, comprising:
means for transporting a microcapsule film medium having a latent image on a first surface;
heater means for raising the temperature of said film medium to a developing temperature of said latent image; and
transfer roller means for simultaneously applying both heat and a pressure sufficient to transfer a developed image from said film medium to a transfer medium, the transfer roller means comprising first and second rollers that deliver said pressure and heat in a pinching contact with said film and transfer mediums, the heater disposed within said first roller such that said developing temperature and said transfer pressure heat are substantially at the same levels.

13. The system of claim 12, further comprising:
temperature sensing means for maintaining said development temperature in heat communication with the transfer roller means.

14. The system of claim 12, wherein:
said first and second rollers have a soft covering of plastic.

15. The system of claim 12, wherein:
said first and second rollers have a covering of silicon rubber.

16. The system of claim 14, wherein:
said covering is about 0.1 mm thick.

17. The system of claim 12, wherein:
said first and second rollers have a covering of urethane rubber.

18. The system of claim 17, wherein:
said covering is about 2.0 mm thick.

19. The system of claim 12, wherein:
the heater comprises a halogen lamp.

20. The system of claim 12, further comprising:
a second heater means for raising the temperature of said film medium to a developing temperature of said latent image, the second heater means in heat communication with said film medium and such that said developing temperature and said transfer pressure heat are substantially equal.

* * * * *